United States Patent [19]

Tobey, Jr. et al.

[11] 3,975,648
[45] Aug. 17, 1976

[54] FLAT-BAND VOLTAGE REFERENCE

[75] Inventors: Morley C. Tobey, Jr., Sunnyvale; David J. Giuliani, San Carlos; Peter B. Ashkin, Sunnyvale, all of Calif.

[73] Assignee: Hewlett-Packard Company, Palo Alto, Calif.

[22] Filed: June 16, 1975

[21] Appl. No.: 587,188

[52] U.S. Cl. .............................. 307/297; 307/296; 307/304; 357/23; 357/41; 357/54
[51] Int. Cl.² .................... H03K 1/12; H03K 1/00; H03K 1/02; H03K 3/353
[58] Field of Search ...................... 357/23, 41, 54; 307/304, 296, 297; 323/22 T

[56] References Cited
UNITED STATES PATENTS

| | | | |
|---|---|---|---|
| 3,673,471 | 6/1972 | Klein et al. | 357/23 |
| 3,806,742 | 4/1974 | Powell | 307/297 |
| 3,868,274 | 2/1975 | Hubar et al. | 357/41 |
| 3,870,906 | 3/1975 | Hughes | 307/297 |
| 3,875,430 | 4/1975 | Prak | 307/297 |

OTHER PUBLICATIONS

MacHattie "A Highly Stable Current or Voltage Source" J. of Physics E: Scientific Instruments (GB) vol. 5 (10/72) pp. 1016–1017.

*Primary Examiner*—William D. Larkins
*Assistant Examiner*—Gene M. Munson
*Attorney, Agent, or Firm*—Theodore S. Park

[57] ABSTRACT

A flat-band voltage reference includes two insulated-gate field-effect transistors, hereinafter IGFETs, which are substantially identical except for their flat-band voltage characteristics and which are biased to carry equal drain currents at equal drain voltages. The resulting difference in potential between the gate contacts of the IGFETs produces a voltage reference which is substantially independent of variances in operating points, supply potentials, and temperature.

22 Claims, 11 Drawing Figures

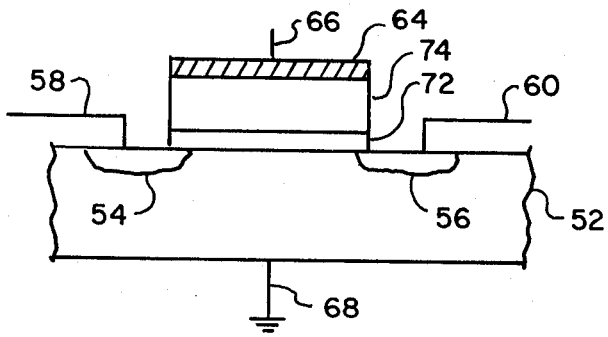
Figure 3
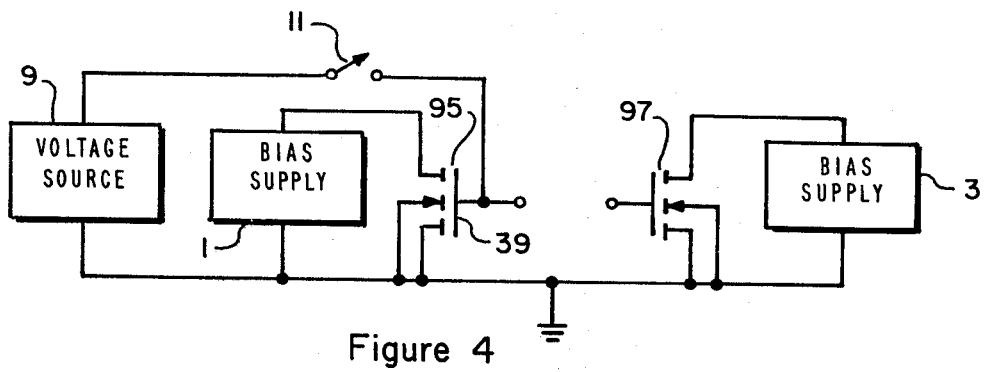
Figure 4
|     | Al  | Au  | Cr  | Mg  | Mo  | Pd  | Pt  | (n+) Si | Ti  | V   | W   |
| --- | --- | --- | --- | --- | --- | --- | --- | ------- | --- | --- | --- |
| Al  | -   | 0.5 | 0.3 | 0.6 | 0.0 | 0.5 | 1.0 | 0.3     | 0.4 | 0.1 | 0.2 |
| Au  |     | -   | 0.2 | 1.1 | 0.5 | 0.0 | 0.5 | 0.8     | 0.9 | 0.6 | 0.3 |
| Cr  |     |     | -   | 0.9 | 0.3 | 0.2 | 0.7 | 0.6     | 0.7 | 0.4 | 0.1 |
| Mg  |     |     |     | -   | 0.6 | 1.1 | 1.6 | 0.3     | 0.2 | 0.5 | 0.8 |
| Mo  |     |     |     |     | -   | 0.5 | 1.0 | 0.3     | 0.4 | 0.1 | 0.2 |
| Pd  |     |     |     |     |     | -   | 0.5 | 0.8     | 0.9 | 0.6 | 0.3 |
| Pt  |     |     |     |     |     |     | -   | 1.3     | 1.4 | 1.1 | 0.8 |
| (n+) Si |     |     |     |     |     |     |     | -       | 0.1 | 0.2 | 0.5 |
| Ti  |     |     |     |     |     |     |     |         | -   | 0.3 | 0.6 |
| V   |     |     |     |     |     |     |     |         |     | -   | 0.3 |
| W   |     |     |     |     |     |     |     |         |     |     | -   |
Figure 5

FLAT-BAND VOLTAGE REFERENCE

BACKGROUND AND SUMMARY OF THE INVENTION

Typical solid-state voltage reference devices generally obtain a reference voltage from a predictable breakdown voltage or from a known forward biased current-voltage relationship of a junction device. Temperature dependence of one device is often compensated by combination with another device also having a temperature dependence. A constant-current source is usually required for the best precision.

The invention is a voltage reference comprising a pair of field-effect devices each substantially identical to the other except for its flat-band voltage. Each field-effect device is biased with a substantially identical drain current, thereby producing a reference voltage between their respective gate field plates corresponding to the difference in flat-band voltages of the two field-effect devices. The invention provides an improved voltage reference which is substantially independent of variances in operating points, supply potentials and temperature.

DESCRIPTION OF THE DRAWINGS

FIG. 3 is a schematic cross-section of a double insulator IGFET.

FIG. 4 is a diagram of a voltage reference made in accordance with the invention including means for electrically injecting charge into the insulator of one of the IGFETs.

FIG. 5 is a table of combinations of metals used for the gates of two IGFETs and approximate expected reference voltages resulting therefrom.

DESCRIPTION OF THE PREFERRED EMBODIMENT

Figure 1:
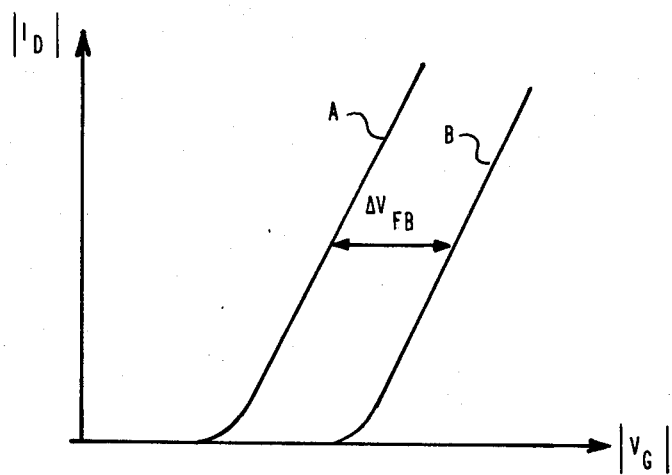
FIG. 1 is a graph showing typical electrical characteristics of two insulated-gate field-effect transistors differing only in their flat-band voltages and having a constant and identical source-to-drain voltage and a constant and identical source-to-substrate voltage applied to each.

Referring to FIG. 1, typical electrical characteristics of two IGFETs differing only in their flat-band voltages are shown for a constant drain-to-source voltage $V_D$ and a constant bulk-to-source voltage $V_B$ applied to each. The parallel electrical characteristics A and B depicted in FIG. 1 differ by a substantially constant amount equal to the difference in flat-band voltages.

In the preferred embodiment a substrate contact of each IGFET is connected to its respective source contact, although this is not essential to the invention. P-channel IGFETs, for example, operated above turn-on out below pinch-off, are described by the following equation:

$$I_D = \frac{Z}{L}\mu_p C_o \left\{ \left[ V_G - V_{FB} - 2\phi_F - \frac{V_D}{2} \right] V_D - \frac{2}{3} \frac{\sqrt{2\epsilon_s q N_D}}{C_o} \left[ |V_D + 2\phi_F|^{3/2} - |2\phi_F|^{3/2} \right] \right\} \quad \text{Eq. (1)}$$

where $I_D$ is the drain current, $Z$ is the channel width, $L$ is the channel length, $\mu_p$ is the effective mobility of holes in the channel, $C_o$ is the oxide capacitance per unit area, $V_G$ is the gate-to-substrate voltage, $V_{FB}$ is the flat-band voltage, $\phi_F$ is the Fermi potential, $\epsilon_s$ is the semiconductor dielectric constant, $q$ is the magnitude of the electronic charge and $N_D$ is the donor density in the semiconductor.

An IGFET operated in the pinch-off condition is also described by Equation (1) wherein the value for $V_D$ is constant and $V_D$ is given by:

$$V_D = V_{Dsat} = V_G - V_{FB} - 2\phi_F - \frac{\epsilon_s q N_D}{C_o^2} \left[ 1 - \sqrt{1 - \frac{2C_o^2(V_G - V_{FB})}{\epsilon_s q N_D}} \right] \quad \text{Eq. (2)}$$

For two IGFETs, identical except for their flat-band voltages and biases with equal $I_D$'s in pinch-off or equal $I_D$'s and $V_D$'s below pinch-off, the quantity $(V_G - V_{FB})$ is identically equal. A reference voltage can therefor be developed which is:

$$V_{Ref} = \Delta V_G = \Delta V_{FB} \quad \text{Eq. (3)}$$

where $V_{Ref}$ is the reference voltage, $\Delta V_G$ is the difference in gate voltages and $\Delta V_{FB}$ is the difference in flat-band voltages. This reference voltage is developed whether or not the IGFETs are operated above or below pinch-off. It is also developed when the IGFETs are operated below turn-on so long as identical $I_D$'s and $V_D$'s are maintained.

Figure 2:
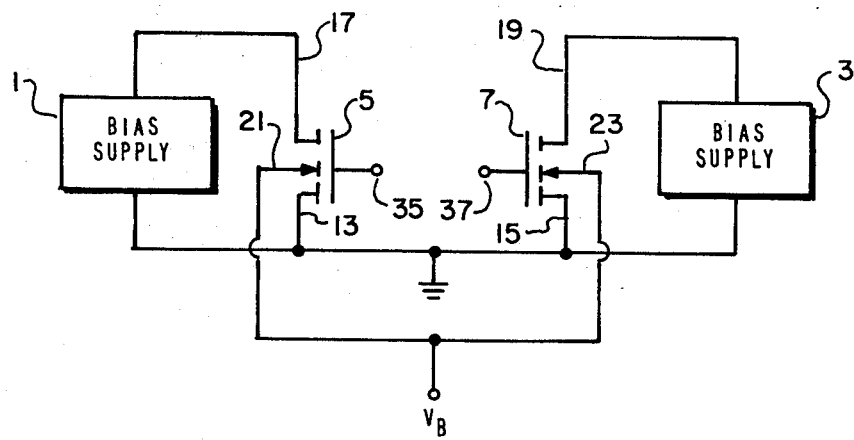
FIG. 2 is a diagram of a voltage reference made in accordance with the invention.

Referring to FIG. 2, there is shown a first preferred embodiment made in accordance with the invention. A first n-channel IGFET 5 and a second n-channel IGFET 7 are substantially identical except for different flat-band voltages. A bias supply 1 is connected between source contact 13 and drain contact 17 of IGFET 5 and a bias supply 3 is connected between source contact 15 and drain contact 19 of the IGFET 7. Substrate contacts 21 and 23 of IGFET 5 and IGFET 7, respectively, are attached to potential $V_B$. The potential of gate contact 35 of IGFET 5 and gate contact 37 of IGFET 7 are adjusted by gate biasing means not shown in FIG. 2. The gate biasing means not shown in FIG. 2, the supply source 1 and the supply source 3 are adjusted such that the drain-to-source voltage of IGFET 5 is substantially equal to the drain-to-source voltage of IGFET 7 and such that the drain current of IGFET 5 is substantially equal to the drain current of IGFET 7. A reference voltage, $V_{Ref}$, is produced by the difference between the potentials of the gate contact 35 of IGFET 5 and the gate contact 37 of IGFET 7.

The flat-band voltage is expressed as:

$$V_{FB} = \Phi_{MS} - \frac{Q_{IS}}{C_o} - \frac{Q_{SS}}{C_o} - \frac{1}{C_o}\int_0^{x_o} \frac{x}{x_o}\rho(x)dx \quad \text{Eq. (4)}$$

where $\Phi_{MS}$ is the work-function difference between the material used for the gate field plate and the substrate material, $Q_{IS}$ is the charge per unit area in the interface states, $Q_{SS}$ is the fixed charge per unit area located at the semiconductor-insulator interface and the integral accounts for charge distributed throughout the insulator. $\rho(x)$ is the charge density in the insulator located at a distance $x$ from the metal and $x_o$ is the thickness of the insulator. Referring to Equation (4) a change in $V_{FB}$ is obtained either by changing one of the charge components in the insulator (i.e., interface-state density with a resulting change in the interface-state charge, fixed-charge at the semiconductor-insulator interface or charge distributed throughout the insulator or the like or by changing the work-function difference $\Phi_{MS}$.

different densities of interface states are obtained by, for example, subjecting one IGFET to a post-metalization anneal and bias cycle (See, for example, B. E. Deal, M. Sklar, A. S. Grove, and E. H. Snow, "Characteristics of the Surface-State Charge [$Q_{SS}$] of Thermally Oxidized Silicon," *J. Electrochemical Society*, Volume 114, pages 266–274, March 1967), or by utilizing a first substrate of a first crystallographic orientation for the first IGFET and a second substrate of a second crystallographic orientation for the second IGFET (See, for example, A. Goetzberger and S. M. Sze, "Metal-Insulator-Semiconductor [MIS] Physics," *Applied Solid State Science*, Volume 1, Raymond Wolfe and C. J. Kriessman [Eds.], Academic Press, New York [1969]). These techniques also result in different fixed charge at the two semiconductor-insulator interfaces (See "Characteristics of the Surface-State Charge [$Q_{SS}$] of Thermally Oxidized Silicon" as cited above).

Different densities of charge distributed throughout the insulators are obtained by, for example, exposing one IGFET to energetic particles, as for example, electrons, protons, molecules or atoms, or electromagnetic radiation, as for example, light or gamma rays, so as to ionize traps in the oxide (See "Metal-Insulator-Semiconductor [MIS] Physics" as cited above). Another technique is to introduce ionized atoms or molecules into one gate insulator (See, for example, A. S. Grove, *Physics and Technology of Semiconductor Devices*, John Wiley and Sons, New York [1967]). Still another technique for obtaining different insulator charge is to electrically inject charge carriers into the insulator region as, for example, by applying a large voltage between one of the substrates and its gate field plate. Elevating the insulator temperature is often used to reduce the time necessary for sufficient charge injection. Another technique is to bias one gate field plate at sufficiently high bias so as to drift the ionic or trapped charge in that insulator from its initial distribution. Elevating the insulator temperature reduces the time required for sufficient redistribution.

FIG. 3 is a schematic cross-section of a multiple insulator IGFET which is, for example, fabricated using the well-known metal-nitride-oxide-silicon technology wherein a first insulator 72 which is, for example, silicon dioxide, and a second insulator 74 which is, for example, silicon nitride, are placed between the substrate 52 and the gate field plate 64. Insulator 72 is preferably less than 100 Angstroms in thickness and a voltage of several volts or more between the gate field plate 64 and the substrate 52 results in charge carriers tunneling through the first insulator 72 into the second insulator 74 wherein substantially all of the charge is trapped.

Referring to FIG. 4, IGFETs 95 and 97 are matched IGFETs which could, for example, have single or multiple insulators. Voltage source 9 is applied to gate field plate 39 by closing switch 11 for transferring charge thereby producing a different $V_{FB}$ for IGFET 95 from that for IGFET 97.

Different $\Phi_{MS}$'s are obtained by employing different metals for the different gate field plates. Different $\Phi_{MS}$'s between the two IGFETs are also obtained by combining different semiconductor materials or a semiconductor material and a metal in place of different gate metals.

Referring to FIG. 5, there is shown a table of representative combinations of gate metals and a semiconductor and the approximate expected $V_{Ref}$'s from experimental data on individual metal-vacuum surfaces. The $V_{Ref}$ obtained will differ somewhat from these values due to differences associated with fabrication techniques. Two gate field plate materials should preferably be selected which exhibit a low difference in temperature coefficient and adhere well to $SiO_2$.

At present the use of two different gate field plate materials is the preferred embodiment as a result of long term stability and equal mobility considerations. The preferred embodiment is fabricated using the well-known metal-oxide-semiconductor technology. The matching of the two IGFETs is enhanced by fabricating them in close proximity to each other on the same substrate. The interface states then have substantially the same occupancy and the mobilities are substantially the same in both IGFETs when operated with substantially the same drain current and the same drain voltage. Effects resulting from temperature dependencies of the mobilities, the Fermi potentials, and the semiconductor surface potentials will thereby be minimized. Effects resulting from variations in the supply potential are also minimized.

Figure 6:
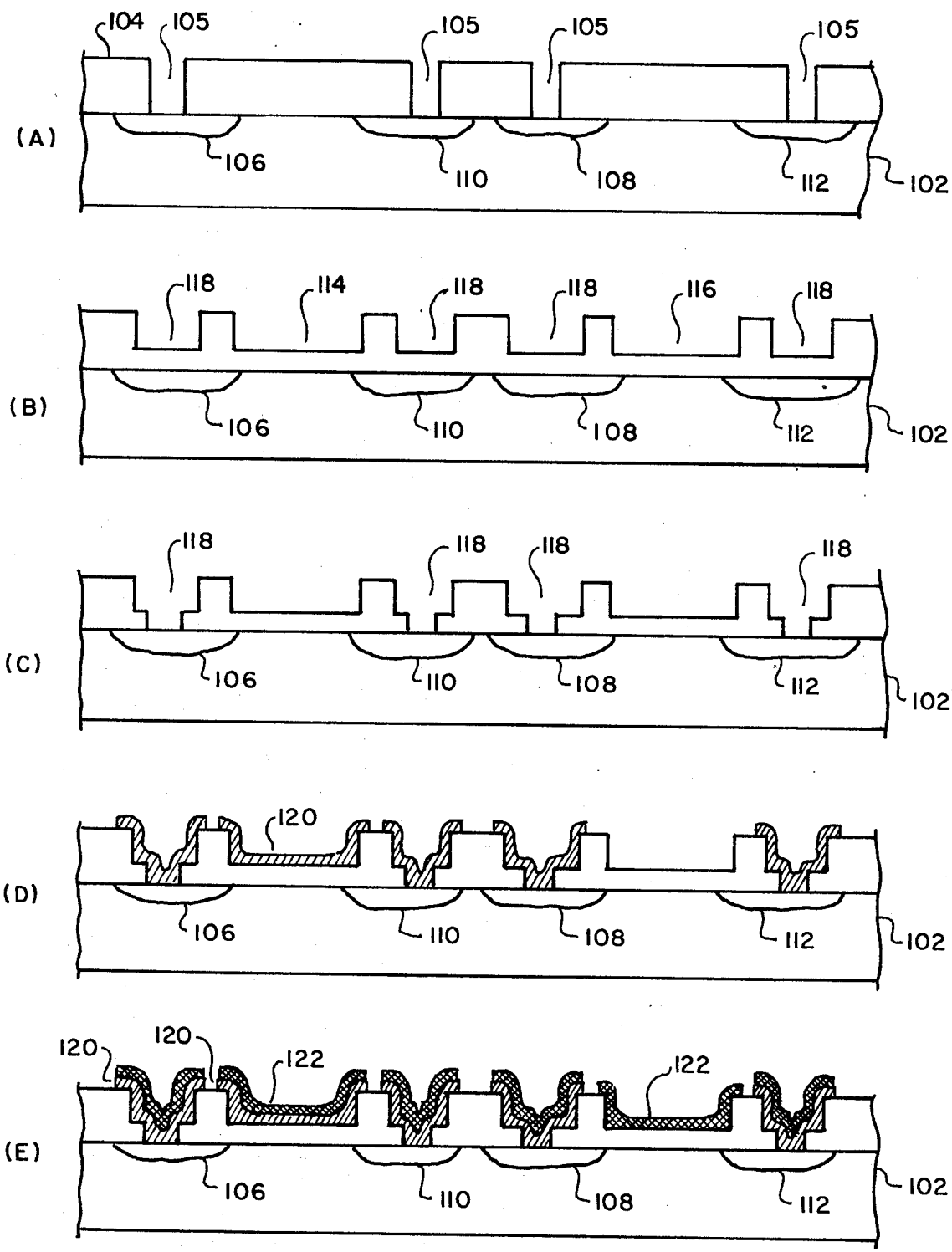
FIG. 6 is a diagram illustrating the processing steps for fabricating a voltage reference monolithically in accordance with the invention.

The processing steps for monolithic fabrication of the two IGFETs using two different metals for the two different gate field plates are shown in FIG. 6.

Referring to drawing A of FIG. 6, a substrate 102 which is, for example, n-type silicon, is first cleaned and polished. A field oxide 104 is grown, openings 105 in the field oxide 104 are made and p-type dopants are diffused into the substrate 102 to form source contacts 106 and 108 and drain contacts 110 and 112. Referring to drawing B of FIG. 6, the field oxide 104 is removed in the region between the source diffusion 106 and the drain diffusion 110 and in the region between the source diffusion 108 and the drain diffusion 112. Contact openings 118 are also etched at this time. Gate oxides 114 and 116 are than grown. Referring to drawing C of FIG. 6, contact openings 118 are re-opened as shown. Referring to drawing D of FIG. 6, a first metal is deposited over the wafer and removed everywhere except for a first gate field plate 120, the source and drain contacts 106, 108, 110, 112, and any necessary interconnecting metal and bonding pads. Referring to drawing E of FIG. 6, a second metal is then deposited over the wafer and removed everywhere except for a second gate field plate 122 and wherever the first metal remains. Modifications to the above processing steps are also possible.

One such modification is to fabricate the two IGFETs either on the same or different substrates using the same processing steps until after the contact openings have been re-opened. The IGFETs are separated and different gate field plate metals and interconnecting metals are deposited on each.

$V_{Ref}$ is temperature dependent only to the extent of any mismatches in the IGFETs and to the extent of the difference in temperature coefficients of their respective resulting work-function differences.

Figure 7:
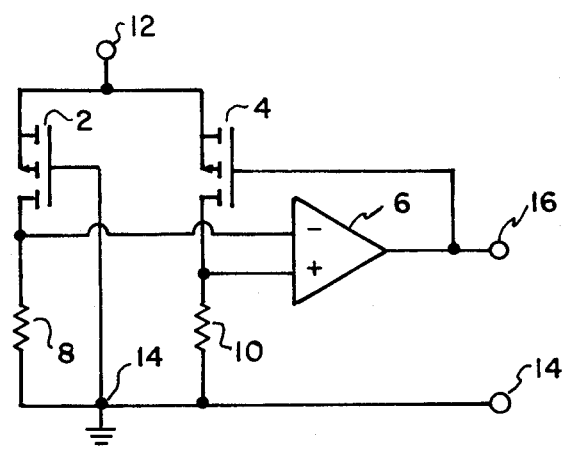
FIG. 7 is a diagram of another voltage reference made in accordance with the invention.

Referring to FIG. 7, there is shown another preferred embodiment made in accordance with the invention. A first p-channel IGFET 2 and a second p-channel IGFET 4 are substantially identical except for different flat-band voltages. An amplifier 6 is coupled to drive the gate of IGFET 4. Amplifier 6 has an inverting input connected to the drain contact of IGFET 2 and a resistor 8 and a non-inverting input connected to the drain contact of IGFET 4 and a resistor 10. Amplifier 6 has a large input impedance as compared with the resistances of resistors 8 and 10. A supply voltage is coupled across terminal 12 and ground 14. The gate contact of IGFET 2, resistor 8 and resistor 10 are connected to ground 14. The drain currents and drain voltages of IGFET 2 and IGFET 4 are maintained substantially equal by selecting matching resistances 8 and 10 and the action of amplifier 6 driving the gate field plate of IGFET 4. A reference voltage is obtained across terminals 16 and 14.

Figure 8:
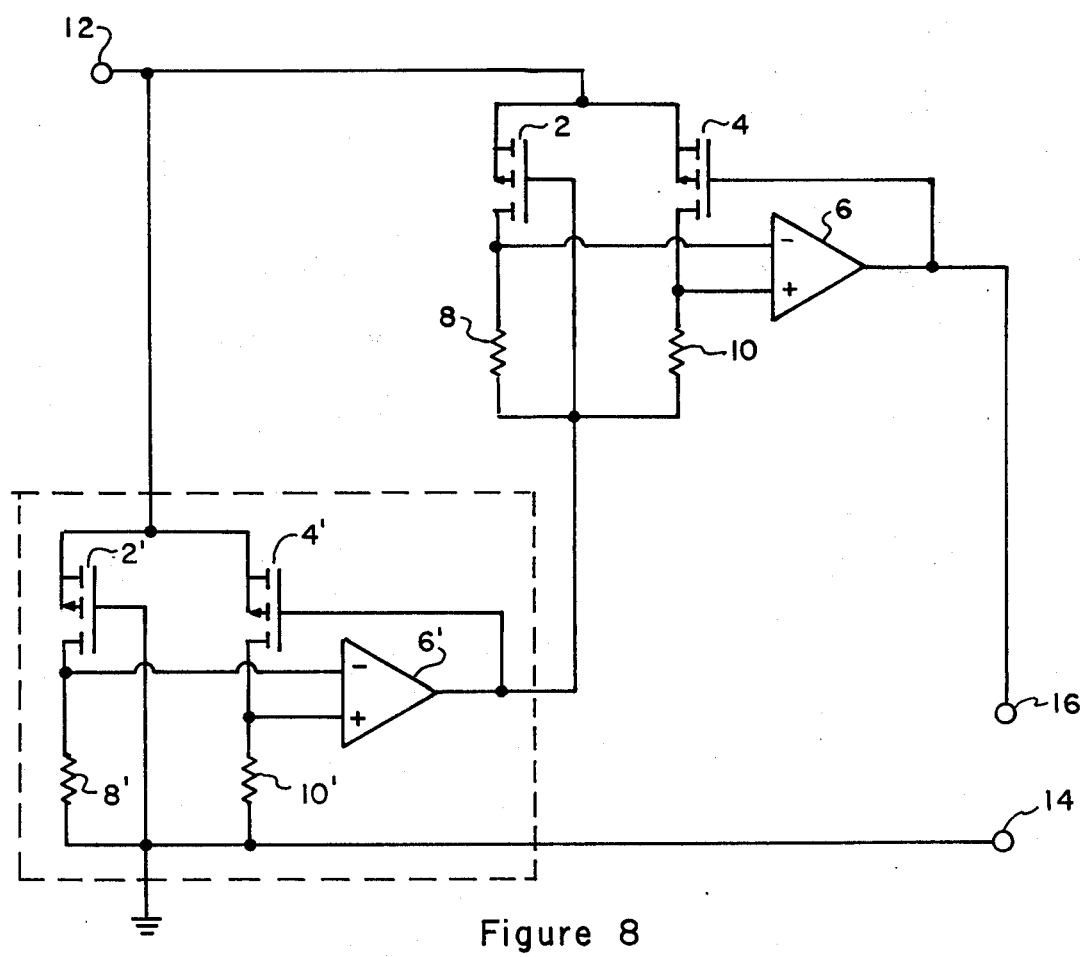
FIG. 8 is a diagram showing a method for combining a plurality of voltage references made in accordance with the invention to achieve larger reference voltages.

Referring to FIG. 8, there is shown a combination comprising two of the voltage references depicted in FIG. 7. A plurality of reference may be similarly combined to provide larger reference voltages.

Figure 9:
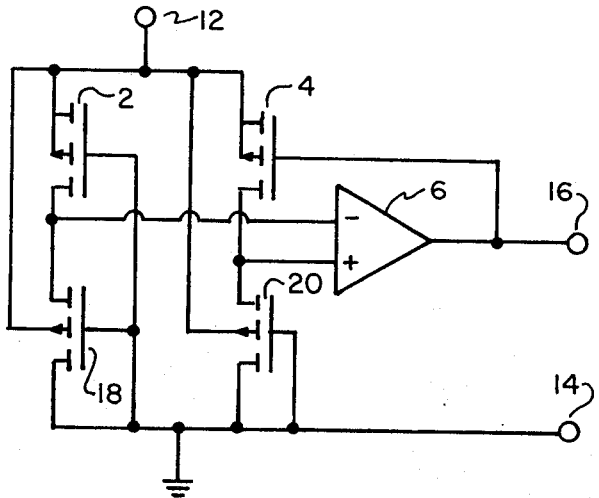
FIG. 9 shows a preferred voltage reference wherein surface area required for integrated fabrication is minimized.

Referring to FIG. 9, matched IGFETs 18 and 20 are substituted for the matched resistors 8 and 10 in the embodiment depicted in FIG. 7. This substitution allows conservation of substrate area should large resistance values be required for the resistors R8 and R10.

Other $V_{FB}$ dependent parameters, as for example, the AC (alternating current) conductance and transconductance, of the IGFETs can also be detected and used to adjust the bias conditions such that a reference voltage is obtained.

Figure 10:
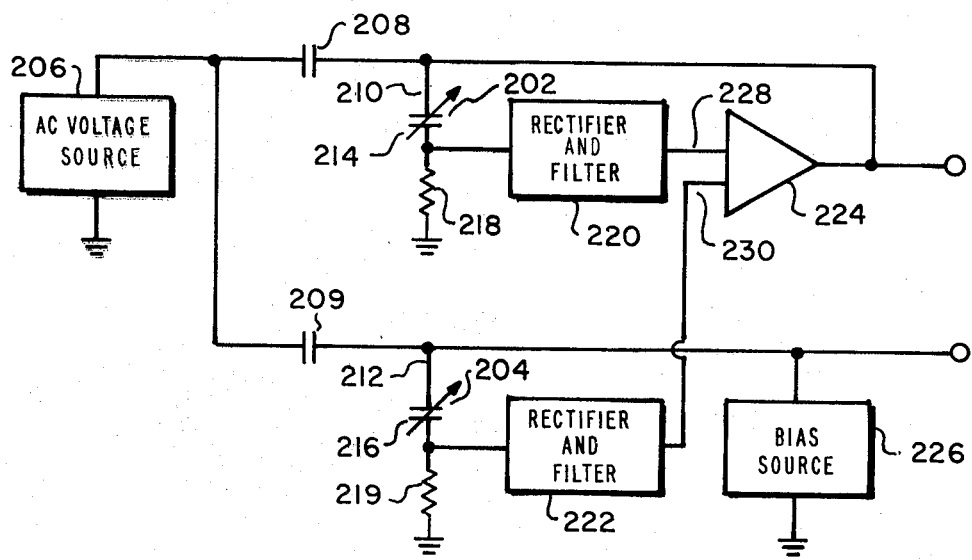
FIG. 10 is a diagram of a preferred embodiment utilizing field-effect capacitors in accordance with the invention.

Referring to FIG. 10, a preferred embodiment made in accordance with the invention using field-effect capacitors is shown.

The gate field plate-to-substrate voltage for a field-effect capacitor is given by:

$$V_G = \phi_s - \frac{Q_s}{C_o} + V_{FB} \qquad \text{Eq. (5)}$$

where $V_G$ is the gate field plate-to-substrate voltage, $\Phi_s$ is the surface potential, $Q_s$ is the charge per unit area in the semiconductor, $C_o$ is the oxide capacitance per unit area and $V_{FB}$ is the flat-band voltage. Appropriate gate field plate voltages are applied to each of two field-effect capacitors such that the same $\phi_s$ is obtained for each field-effect capacitor, thereby resulting in the same $Q_s$ in each field-effect capacitor. Each field-effect capacitor is substantially identical to the other except for flat-band voltages. A reference voltage $V_{Ref}$ is produced which is given by:

$$V_{Ref} = V_{G1} - V_{G2} = V_{FB1} - V_{FB2} \qquad \text{Equation (6)}$$

where $V_{G1}$ and $V_{G2}$ are the gate field plate-to-substrate voltages for first and second field-effect capacitors and $V_{FB1}$ and $V_{FB2}$ are the respective flat-band voltages for the first and second field-effect capacitors. $V_G$ is varied to obtain matching capacitance and therefor matching $\phi_s$. Flat-band voltages are varied as described hereinbefore with respect to field-effect transistors.

Referring to FIG. 10, a first field-effect capacitor 202 and a second field-effect capacitor 204 are substantially identical except for different flat-band voltages. An AC (alternating current) voltage source 206 is coupled by coupling capacitors 208 and 209 to gate field plates 210 and 212 of the field-effect capacitors 202 and 204. Substrate contacts 214 and 216 of the field-effect capacitors 202 and 204 are coupled to ground by resistors 218 and 219. Resistors 218 and 219 are of substantially identical resistance and are each respectively coupled to rectifiers and filters 220 and 222 as shown. Outputs 228 and 230 of the rectifiers and filters 220 and 222 are coupled to differential inputs of amplifier 224. The amplifier 224 has an output coupled to the gate field plate 210 of the field-effect capacitor 202.

The resistance of resistors 218 and 219 is selected to be less than the magnitude of the reactance of field-effect capacitor 202. Biasing means 226 adjusts the capacitance of field-effect capacitor 204 to a convenient value and biasing means 226 has an impedance of magnitude greater than the magnitude of the reactance of field-effect capacitor 204. The magnitude of reactances of coupling capacitors 208 and 209 are chosen to be less than the magnitude of reactances of field-effect capacitor 202 and 204 at the frequency of AC voltage source 206.

Alternating current voltages having values substantially proportional to the capacitances of field-effect capacitors 202 and 204 are developed at substrate contacts 214 and 216. These voltages are converted to direct current voltages by rectifiers and filters 220 and 222 to produce signals at outputs 228 and 230 which drive amplifier 224. Amplifier 224 drives the voltage at the gate field plate 210 of field-effect capacitor 202 until the capacitance of field-effect capacitor 202 is substantially equal to the capacitance of field-effect capacitor 204. The reference voltage $V_{Ref}$ is developed between gate field plate 210 and gate field plate 212 and is substantially equal to the difference in flat-band voltages of field-effect capacitors 202 and 204.

Figure 11:
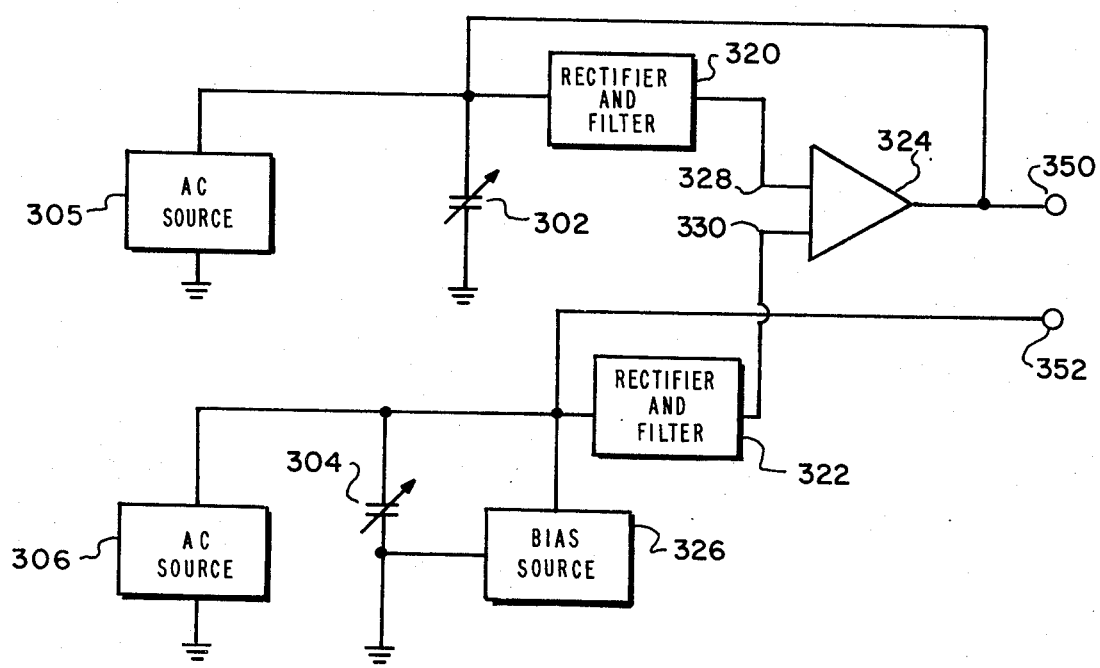
FIG. 11 is a diagram of another preferred embodiment utilizing field-effect capacitors.

Referring to FIG. 11, there is shown another preferred embodiment made in accordance with the invention. Substantially identical AC current sources 305 and 306 drive substantially identical currents into field-effect capacitors 302 and 304 which are substantially identical except for their flat-band voltages. Rectifying and filtering means 320 and 322 are connected to field-effect capacitors 302 and 304 respectively.

A DC voltage is produced at input terminals 328 and 330 of amplifier 324 which forces the output of amplifier 324 to bias field-effect capacitor 302 such that its capacitance is substantially identical to that of field-effect capacitor 304. A reference voltage $V_{Ref}$ is produced between terminals 350 and 352 which is substantially equal to the difference in the flat-band voltages of field-effect capacitors 302 and 304. Bias source 326 is adjusted to obtain a convenient value of capacitance.

Differences in field-effect capacitor flat-band voltages are produced, for example, by techniques disclosed hereinbefore with respect to field-effect transistors.

Other $V_{FB}$ dependent parameters, as for example tunneling currents in thin oxide devices, of field-effect capacitors can also be detected and used to adjust the bias conditions such that a reference voltage is obtained.

We claim:

1. A voltage reference comprising:
   first and second field-effect devices, each having a source contact, a drain contact, and a gate contact and each device having a different flat-band voltage characteristic from the other;
   means coupled to the first and second field-effect devices for producing substantially identical current flow to the drain contacts of the first and second field-effect devices; and
   means for coupling to the gate contacts of the first and second field-effect devices.

2. A voltage reference as in claim 1 wherein the first and second field-effect devices have substrates of substantially similar semiconductor material, the first field-effect device has a first gate field plate of a first metal and the second field-effect device has a second gate field plate of a second metal for producing different respective metal to semiconductor work-function differences in the first and second field-effect devices.

3. A voltage reference as in claim 1 wherein the first and second field-effect devices have substrates of a first semiconductor material, a gate field plate of the first-effect device is of a second semiconductor material and a gate field plate of the second field-effect device is of a third semiconductor material, the first and second semiconductor materials in combination producing a semiconductor to semiconductor work-function difference which is different from the semiconductor to semiconductor work-function difference of the first and third semiconductor materials.

4. A voltage reference as in claim 1 wherein the first and second field-effect devices have similar semiconductor substrates, the first field-effect device has a gate field plate made of a material including semiconductor material and the second field-effect device has a gate field plate made of material including a metal.

5. A voltage reference as in claim 1 wherein the first field-effect device has a first interface state density and the second field-effect device has a second interface state density.

6. A voltage reference as in claim 1 wherein the first field-effect device has a semiconductor substrate coupled to an insulator and a first fixed charge per unit area located at its semiconductor to insulator interface and the second field-effect device has a semiconductor substrate coupled to an insulator and a second fixed charge per unit area located at its semiconductor to insulator interface.

7. A voltage reference as in claim 1 wherein the first field-effect device has a insulator with a first charge distribution and the second field-effect device has an insulator with a second charge distribution.

8. A voltage reference as in claim 1 wherein the first field-effect device has a semiconductor substrate and multiple insulators, the insulator contacting the semiconductor substrate of the first field-effect device being sufficiently thin to permit tunneling; and
   bias means coupled to the gate contact of the first field-effect device for tunneling charge into the first field-effect device and producing a difference between flat-band voltage characteristics of the first and second field-effect devices.

9. A voltage reference as in claim 8 wherein the second field-effect device has multiple insulators, the insulator contacting the semiconductor of the second field-effect device being sufficiently thin to permit tunneling.

10. A voltage reference as in claim 8 wherein the first field-effect device has a silicon substrate, a first insulator of silicon dioxide in contact with the silicon substrate and a second insulator of silicon nitride in contact with the first insulator and the gate contact of the first field-effect device.

11. A voltage reference as in claim 10 wherein the second field-effect device has a silicon substrate, a first insulator of silicon dioxide in contact with the silicon substrate and a second insulator of silicon nitride in contact with the first insulator and the gate contact of the second field-effect device.

12. A voltage reference comprising:
    first and second field-effect capacitors, each having a first and second contact, each having a different flat-band voltage characteristic from the other and each having capacitance variable in response to a voltage applied to the first and second contacts;
    means coupled to the first and second field-effect capacitors for producing substantially identical capacitance in the first and second field-effect capacitors; and
    means for coupling to the first contacts of the first and second field-effect capacitors.

13. A voltage reference as in claim 12 wherein the first and second field-effect capacitors have substrates of substantially similar semiconductor material, the first capacitor has a first gate field plate of a first metal and the second capacitor has a second gate field plate of a second metal for producing different respective metal to semiconductor work-function differences in the first and second field-effect capacitors.

14. A voltage reference as in claim 12 wherein the first and second field-effect capacitors have substrates of a first semiconductor material, a gate field plate of the first capacitor is of a second semiconductor material and a gate field plate of the second capacitor is of a third semicoductor material, the first and second semiconductor materials in combination producing a semiconductor to semiconductor work-function difference which is different from the semiconductor to semiconductor work-function difference of the first and third semiconductor materials.

15. A voltage reference as in claim 12 wherein the first and second field-effect capacitors have similar semiconductor substrates, the first field-effect capacitor has a gate field plate made of semiconductor material and the second field-effect capacitor has a gate field plate made of material including a metal.

16. A voltage reference as in claim 12 wherein the first field-effect capacitor has a first interface state density and the second field-effect capacitor has a second interface state density.

17. A voltage reference as in claim 12 wherein the first field-effect capacitor has a first fixed charge per unit area located at its semiconductor to insulator interface and the second field-effect capacitor has a second fixed charge per unit area located at its semiconductor to insulator interface.

18. A voltage reference as in claim 12 wherein the first field-effect capacitor has an insulator with a first charge distribution and the second field-effect capacitor has an insulator with a second charge distribution.

19. A voltage reference as in claim 12 wherein the first field-effect capacitor has multiple insulators, the insulator contacting the semiconductor of the first field-effect capacitor being sufficiently thin to permit tunneling; and bias means coupled to the gate contact of the first field-effect capacitor for tunneling charge into the first field-effect capacitor and producing a difference between flat-band voltage characteristics of the first and second field-effect capacitors.

20. A voltage reference as in claim 19 wherein the second field-effect capacitor has multiple insulators, the insulator contacting the semiconductor of the second field-effect capacitor being sufficiently thin to permit tunneling.

21. A voltage reference as in claim 19 wherein the first field-effect capacitor has a silicon substrate, a first insulator of silicon dioxide in contact with the silicon substrate and a second insulator of silicon nitride in contact with the first insulator and the gate contact of the first field-effect capacitor.

22. A voltage reference as in claim 21 wherein the second field-effect capacitor has a silicon substrate, a first insulator of silicon dioxide in contact with the silicon substrate and a second insulator of silicon nitride in contact with the first insulator and the gate contact of the second field-effect capacitor.

* * * * *

UNITED STATES PATENT AND TRADEMARK OFFICE
CERTIFICATE OF CORRECTION

PATENT NO. : 3,975,648

DATED : August 17, 1976

INVENTOR(S) : Morley C. Tobey, Jr., David J. Giuliani, and Peter B. Ashkin

It is certified that error appears in the above-identified patent and that said Letters Patent are hereby corrected as shown below:

Column 2, line 15, "out below" should read -- but below --;

Column 3, line 27, "different densities" should read -- Different densities --;

Column 5, line 45, "reference" should read -- references --

Signed and Sealed this

Eighteenth Day of October 1977

[SEAL]

Attest:

RUTH C. MASON
*Attesting Officer*

LUTRELLE F. PARKER
*Acting Commissioner of Patents and Trademarks*